United States Patent

Okumoto et al.

[11] Patent Number: 5,636,435
[45] Date of Patent: Jun. 10, 1997

[54] WORK MOUNTING APPARATUS

[75] Inventors: Yutaka Okumoto, Tokyo; Akiyoshi Natsume; Koji Taira, both of Mie-gun, all of Japan

[73] Assignees: Japan Tobacco Inc., Tokyo; Kabushiki Kaisha Toshiba, Kanagawa, both of Japan

[21] Appl. No.: 515,226

[22] Filed: Aug. 15, 1995

[30] Foreign Application Priority Data

Aug. 18, 1994 [JP] Japan .................................. 6-194333

[51] Int. Cl.$^6$ .................................................. H05K 13/04
[52] U.S. Cl. .................................. 29/740; 29/741; 29/743; 29/759
[58] Field of Search .............................. 29/739, 740, 741, 29/743, 759, 901, DIG. 44

[56] References Cited

U.S. PATENT DOCUMENTS 5,305,518  4/1994  Okumoto ........................... 29/740
5,331,731  7/1994  Suzuki et al. ................... 29/743 X
5,500,997  3/1996  Kobayashi et al. ............... 29/740

FOREIGN PATENT DOCUMENTS 534451    3/1993   European Pat. Off. ........... 29/740
534452    3/1993   European Pat. Off. ........... 29/743
141700    6/1991   Japan ............................. 29/743
1495624  12/1977   United Kingdom .

*Primary Examiner*—Peter Vo
*Attorney, Agent, or Firm*—Birch, Stewart, Kolasch & Birch, LLP

[57] ABSTRACT

A work mounting apparatus comprises a nozzle head which repeatedly makes cycloid motion as a drum rotates while being held in a fixed orientation, a suction nozzle projecting downward from the nozzle head for receiving and mounting a work, and a liquid damper-type balancer for the nozzle head. The balancer contains a movable weight which relatively vibrates so as to cancel out vibration of the nozzle head.

8 Claims, 5 Drawing Sheets

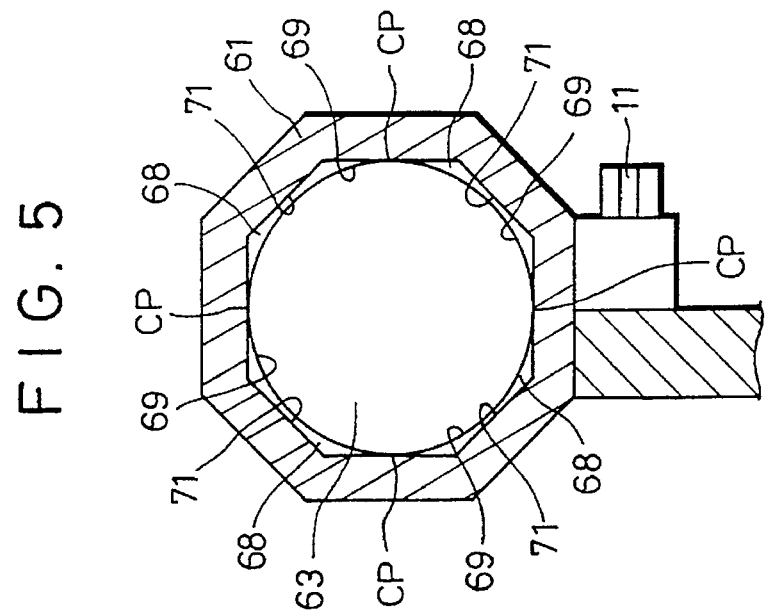
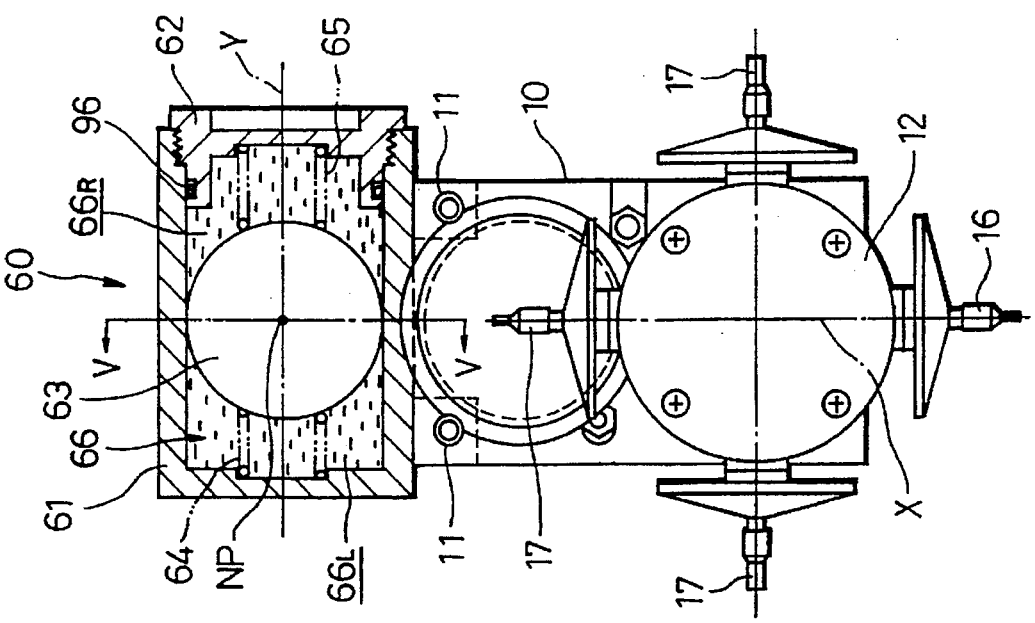

WORK MOUNTING APPARATUS

BACKGROUND OF THE INVENTION

1. Field of the Invention

This invention relates to a work mounting apparatus which utilizes cycloid motion to receive, as works, electronic components such as ICs, capacitors and resistors, from work feeders and to mount the received works onto printed boards.

2. Description of the Related Art

This type of work mounting apparatus is disclosed, for example, in U.S. Pat. No. 5,305,518. The work mounting apparatus disclosed in this U.S. patent has head units arranged along the outer periphery of a drum, and the head units are each rotatable about a turning shaft extending in the radial direction of the drum. Each head unit includes a nozzle head and a balance weight, and the nozzle head has a suction nozzle directed downward. The work mounting apparatus further comprises a plurality of work feeders and a printed board arranged along the outer periphery of the drum, the printed board being placed on an XY table.

As the drum is rotated in one direction, each head unit also is rotated about the turning shaft thereof, causing the suction nozzle to make cycloid motion.

If the cycle of the cycloid motion is suitably controlled, the suction nozzle can attract a work thereto by suction from a desired work feeder and mount the attracted work onto the printed board, by means of the cycloid motion. The cycle of the cycloid motion is controlled by changing the rotational speed of the head unit, that is, the turning shaft thereof.

The balance weight of the head unit is useful in stabilizing the cycloid motion of the nozzle head, but it inevitably increases the mass of the head unit as a whole. Therefore, when the cycle of the cycloid motion of the nozzle head is controlled, the kinetic energy of the head unit greatly varies since the mass of the head unit is large, causing elastic, torsional deformation of the turning shaft of the head unit. Such torsional deformation of the turning shaft increases as the rotational speed of the drum, that is, the speed of the cycloid motion of the nozzle head, increases with the operational speed of the work mounting apparatus.

The elastic, torsional deformation of the turning shaft gives rise to vibration of the head unit, that is, the nozzle head, in the rotating direction of the unit. In some cases, therefore, the suction nozzle fails to securely receive and mount a work.

In order to prevent the torsional deformation of the turning shaft, the diameter of the turning shaft may be increased so that the shaft may have increased rigidity, but in this case, a disadvantage arises in that the work mounting apparatus itself is increased in size.

SUMMARY OF THE INVENTION

It is an object of the present invention to provide a work mounting apparatus in which adverse effects ascribable to the aforementioned cycle control of the cycloid motion or external force are lessened, thereby enabling high-accuracy, high-speed reception and mounting of works.

The above object is achieved by a work mounting apparatus according to the present invention which comprises: a carrier movable along a predetermined transport path, the carrier including a shaft intersecting with the transport path and a receiving/mounting head spaced from the shaft, the receiving/mounting head having a rod-shaped attraction member projecting toward the transport path; turning means for causing the head to revolve around the shaft while maintaining orientation of the head with respect to the transport path during movement of the carrier, the attraction member of the head repeatedly making cycloid motion along the transport path; supply means for supplying the attraction member of the head with an attraction force; control means for controlling the cycle of the cycloid motion and the supply of the attraction force to the attraction member, the attraction member receiving a work from a work receiving position on the transport path and mounting the received work onto a mounting surface on the transport path while making the cycloid motion, the mounting surface being arranged at a distance from the work receiving position; and stabilizing means for stabilizing motion of the attraction member in the revolving direction of the head during revolution of the head.

In the above work mounting apparatus, even when the cycle of the cycloid motion of the attraction member is controlled, or in other words, the rotational speed of the carrier is controlled, during revolution of the head, the stabilizing means suppresses the vibration of the attraction member ascribable to the cycle control. Accordingly, the attraction member can make stable cycloid motion and thus can receive and mount a work with high accuracy.

The stabilizing means is implemented by a balancer mounted on the carrier and having a damping function, and this balancer is arranged on the carrier so as to be symmetrical with respect to the head. Specifically, the balancer includes a casing, a movable weight contained in the casing and capable of reciprocatory movement in the revolving direction of the head, and urging means for elastically urging the movable weight so as to hold the movable weight in a neutral position. The neutral position is situated in a plane containing the center of the head and the axis of the shaft.

The aforementioned cycle control of the cycloid motion is carried out by accelerating or decelerating the rotation of the carrier, and in this case, the shaft of the carrier undergoes elastic, torsional deformation, which causes vibration of the head. However, at this time, accelerating or decelerating the rotation of the carrier also produces an inertial force of the movable weight within the casing. Consequently, the movable weight is displaced from the neutral position due to its own inertial force, against the urging force of the urging means, and is thereafter moved toward the neutral position due to the restoring force of the urging means. Namely, the movable weight vibrates about the neutral position and this vibration cancels out the vibration of the head. As a result, the vibration of the head, that is, the attraction member, is reduced, permitting the attraction member to make stable cycloid motion.

Preferably, the casing has an interior thereof filled with a liquid, and the movable weight divides the interior of the casing into two chambers always communicating with each other. In this case, the movable weight vibrates while forcing the liquid aside, and thus the vibration of the movable weight can be effectively attenuated.

In the case where the casing extends in a direction tangent to the revolution of the head, the urging means can be easily implemented by a pair of springs pressing the movable weight from both sides thereof, that is, a pair of compression coil springs.

The movable weight preferably has a spherical shape, and in this case, the casing has a plurality of guide surfaces for guiding the movement of the movable weight. The guide surfaces serve to prevent shaky motion of the spherical movable weight within the casing.

Preferably, the balancer includes a plurality of restricted passages connecting the two chambers of the casing to each other. The restricted passages are defined between the inner peripheral surface of the casing and the movable weight and are located at regular intervals in the circumferential direction of the movable weight.

When the movable weight vibrates, the restricted passages serve as resistance to the flow of the liquid between the two chambers of the casing and thus promptly attenuate the vibration of the movable weight.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein:

FIG. 4 is a sectional view of the head unit, taken along line IV—IV in FIG. 2;

FIG. 5 is a sectional view of a balancer, taken along line V—V in FIG. 4; and

DETAILED DESCRIPTION OF THE PREFERRED EMBODIMENTS

Figure 1:
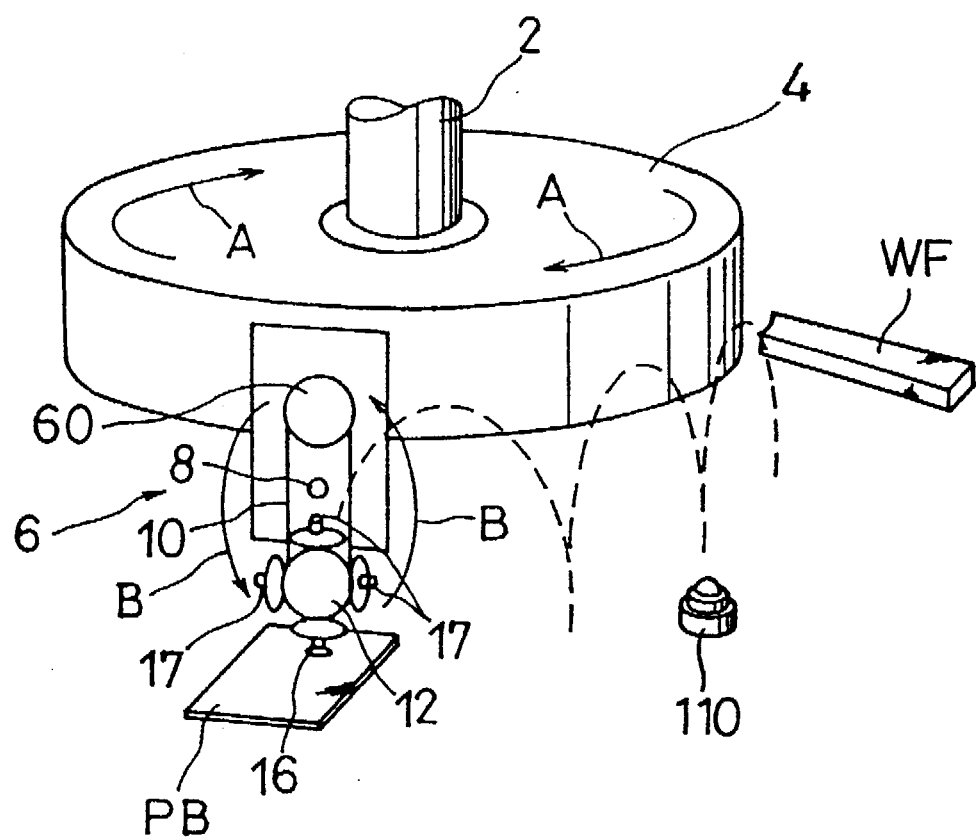
FIG. 1 is a perspective view schematically showing a work mounting apparatus according to an embodiment.

A work mounting apparatus shown in FIG. 1 comprises a center shaft 2, which extends vertically and on which a drum 4 is mounted. The center shaft 2 is connected to a drive motor, described later, which rotates the center shaft 2 in one direction, that is, in the direction of arrow A in FIG. 1, at a fixed speed.

The drum 4 is provided with a number of head units 6 arranged along the outer periphery thereof. The head units 6 are disposed at regular intervals in the circumferential direction of the drum 4. FIG. 1 shows only one of the head units 6.

Each head unit 6 has an identical structure; therefore, in the following, only one head unit 6 will be described.

The head unit 6 is mounted to one end, that is, an outer end, of a turning shaft 8 which extends radially inward of the drum 4 from the head unit 6 toward the center shaft 2. The turning shaft 8 is rotatably supported on the drum 4 and revolves around the center shaft 2 together with the drum 4. A link arm 10 is attached to the outer end of the turning shaft 8 and extends perpendicularly to the shaft 8. The link arm 10 has one end to which a circular nozzle head 12 is rotatably mounted, and the other end to which a balancer 60 is mounted. The inner end of the turning shaft 8 is connected to the drive motor via a power transmission system, described later. Thus, the drive motor rotates not only the drum 4 but also the turning shaft 8.

When the drive motor is driven, the drum 4 and the turning shaft 8 rotate simultaneously. As the drum 4 rotates, the head unit 6 revolves around the center shaft 2 through the medium of the turning shaft 8. Simultaneously, as the turning shaft 8 rotates, the link arm 10 rotates about the axis of the turning shaft 8. Namely, the nozzle head 12 and the balancer 60 attached to the respective opposite ends of the link arm 10 revolve around the turning shaft 8 in the direction of arrow B in FIG. 1. Accordingly, the nozzle head 12 and the balancer 60 revolve around the center shaft 2 and at the same time revolve around the turning shaft 8. In other words, the nozzle head 12 and the balancer 60 repeatedly make up-and-down motion while moving in the circumferential direction of the drum 4.

The nozzle head 12 is provided with, for example, four suction nozzles. The suction nozzles radially project from the outer periphery of the nozzle head 12. Among these suction nozzles, one directed downward is indicated by reference numeral 16 in FIG. 1 while the other suction nozzles are indicated by reference numeral 17. The suction nozzles 16 and 17 are arranged at regular intervals in the circumferential direction of the nozzle head 12. Accordingly, the angle between adjacent suction nozzles is 90 degrees in the circumferential direction of the nozzle head 12.

Among the suction nozzles, the one 16 directed downward can be selectively supplied with blow pressure or suction pressure, as described later. As for the other suction nozzles 17 than the nozzle 16, if the nozzle head 12 is rotated about the axis thereof so that one of the suction nozzles 17 is directed downward, then this suction nozzle 17 can be selectively supplied with blow pressure or suction pressure.

The turning shaft 8 and the nozzle head 12 are connected to each other via a belt-type planetary mechanism, described later. The planetary mechanism is not shown in FIG. 1. The planetary mechanism serves to hold the nozzle head 12 in a fixed orientation at all times even when the nozzle head 12 revolves around the turning shaft 8 in the direction of arrow B. Accordingly, during revolution of the nozzle head 12, the suction nozzle 16 can revolve around the turning shaft 8 while keeping its downward orientation.

The revolving direction B of the nozzle head 12, that is, the suction nozzle 16, coincides with the rotating direction A of the drum 4 when the suction nozzle 16 passes the top dead center, and the revolving direction B is opposite to the rotating direction A of the drum 4 when the suction nozzle 16 passes the bottom dead center. Consequently, the distal end of the suction nozzle 16 moves in the circumferential direction of the drum 4 while tracing a cycloid curve as indicated by the dashed line in FIG. 1.

The cycloid motion of the suction nozzle 16 will be explained in further detail. When the suction nozzle 16 passes the bottom dead center, the ground speed of the suction nozzle 16 (the speed of the nozzle 16 relative to the ground) becomes zero if the revolving speed of the distal end of the suction nozzle 16 revolving around the turning shaft 8 is equal to the revolving speed of the nozzle head 12 revolving around the center shaft 2. Further, the cycle of the cycloid motion can be adjusted by varying the rotating speed of the turning shaft 8.

As shown in FIG. 1, a plurality of work feeders WF and a printed board PB are arranged at a lower level than the drum 4 along the outer periphery of the drum 4, that is, along the locus formed by the nozzle head 12 revolving around the center shaft 2. The region in which the work feeders WF are arranged and the position at which the printed board PB is arranged are spaced from each other in the circumferential direction of the drum 4. The printed board PB is placed on an XY table (not shown), and FIG. 1 shows only one work feeder WF.

The work feeders have respective work supply positions, and these work supply positions and the printed board PB are located on an identical imaginary circle. During the aforementioned cycloid motion of the suction nozzle 16, that is, during repeated up-and-down motion of the suction nozzle 16, the distal end of the suction nozzle 16 reaches the bottom dead center which is right above the imaginary circle with a predetermined gap therebetween. After a work at the work supply position is picked up, each work feeder WF feeds a new work to the work supply position thereof.

If, during the cycloid motion of the nozzle head 12, the cycle of the cycloid motion is appropriately controlled, the distal end of the suction nozzle 16 can reach the bottom dead center at a position above the work supply position of a work feeder or the printed board PB, and at this time, also the speed of the distal end of the suction nozzle 16 relative to the work supply position or the printed board PB can be made zero.

Accordingly, by supplying suction pressure to the suction nozzle 16 immediately before the distal end of the nozzle 16 reaches the work supply position, the suction nozzle 16 can attract a work at the work supply position to the distal end thereof by suction. The work thus attracted is then transported toward the printed board PB with the cycloid motion of the suction nozzle 16.

The suction nozzle 16 thereafter approaches the printed board PB and descends toward the board PB, and immediately before the nozzle 16 reaches the printed board PB, the work is released from the suction. As a result, the work so far attracted to the suction nozzle 16 is mounted onto the printed board PB. If the suction nozzle 16 is supplied with blow pressure when the work is mounted, the blow pressure discharged from the distal end of the nozzle 16 serves to press the work against the printed board PB, whereby the work is reliably mounted.

An electronic camera 110 is arranged between the region of the work feeders WF and the printed board PB at a location beneath the aforementioned imaginary circle, and includes a CCD image sensor. When the suction nozzle 16 carrying the work reaches the bottom dead center right above the electronic camera 110, the camera 110 photographs the work from below. The photographed image shows the orientation of the work attracted to the suction nozzle 16, and thus it is possible to determine the orientation of the attracted work on the basis of the photographed image. More specifically, if it is judged based on the photographed image that the work is attracted to the suction nozzle 16 with the orientation thereof improperly rotated about the axis of the nozzle 16, the suction nozzle 16 is rotated about the axis thereof to correct the orientation of the work.

Figure 2:
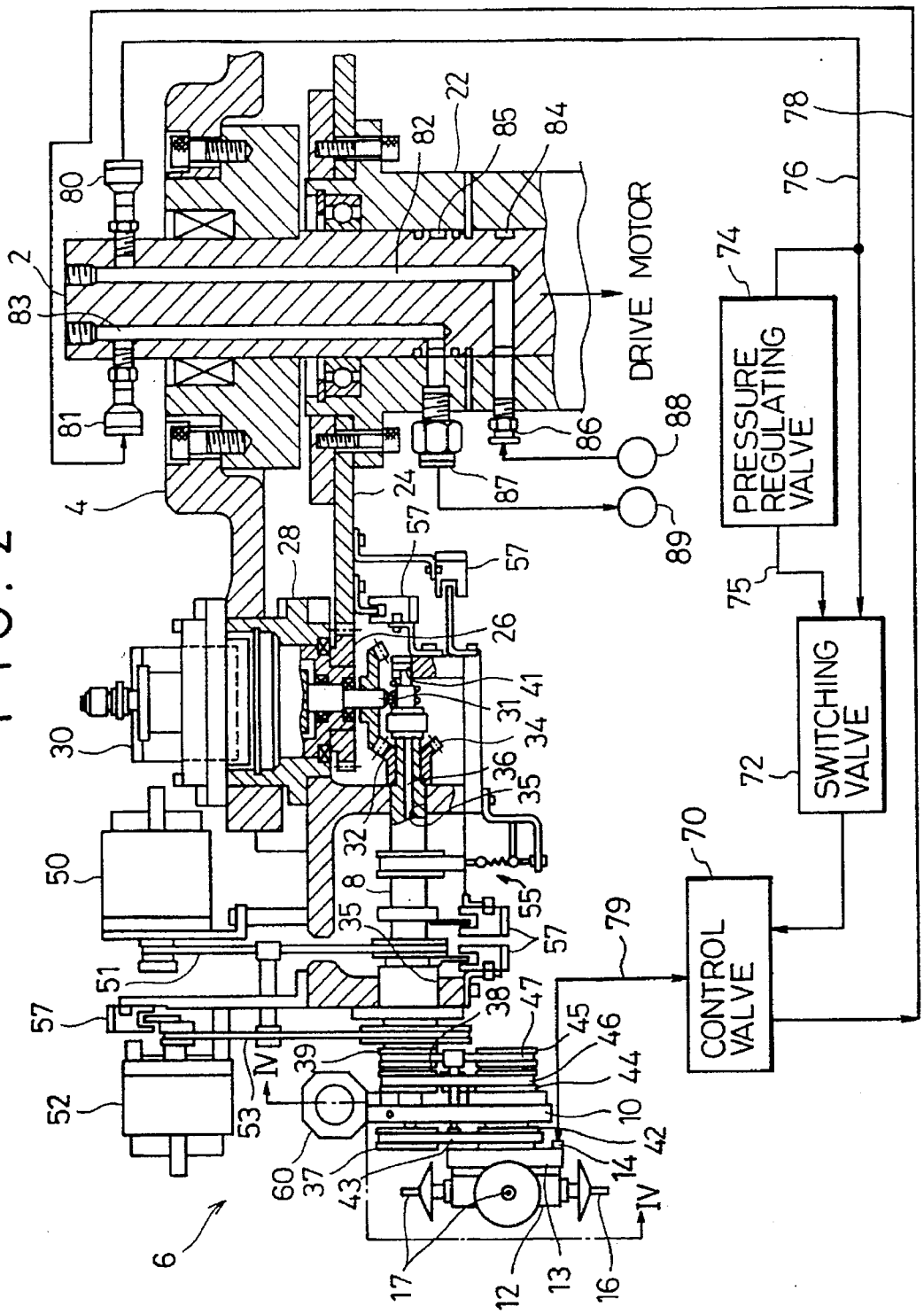
FIG. 2 is a sectional view showing a power transmission system and a pneumatic system associated with one head unit of the work mounting apparatus shown in FIG. 1.
Figure 3:
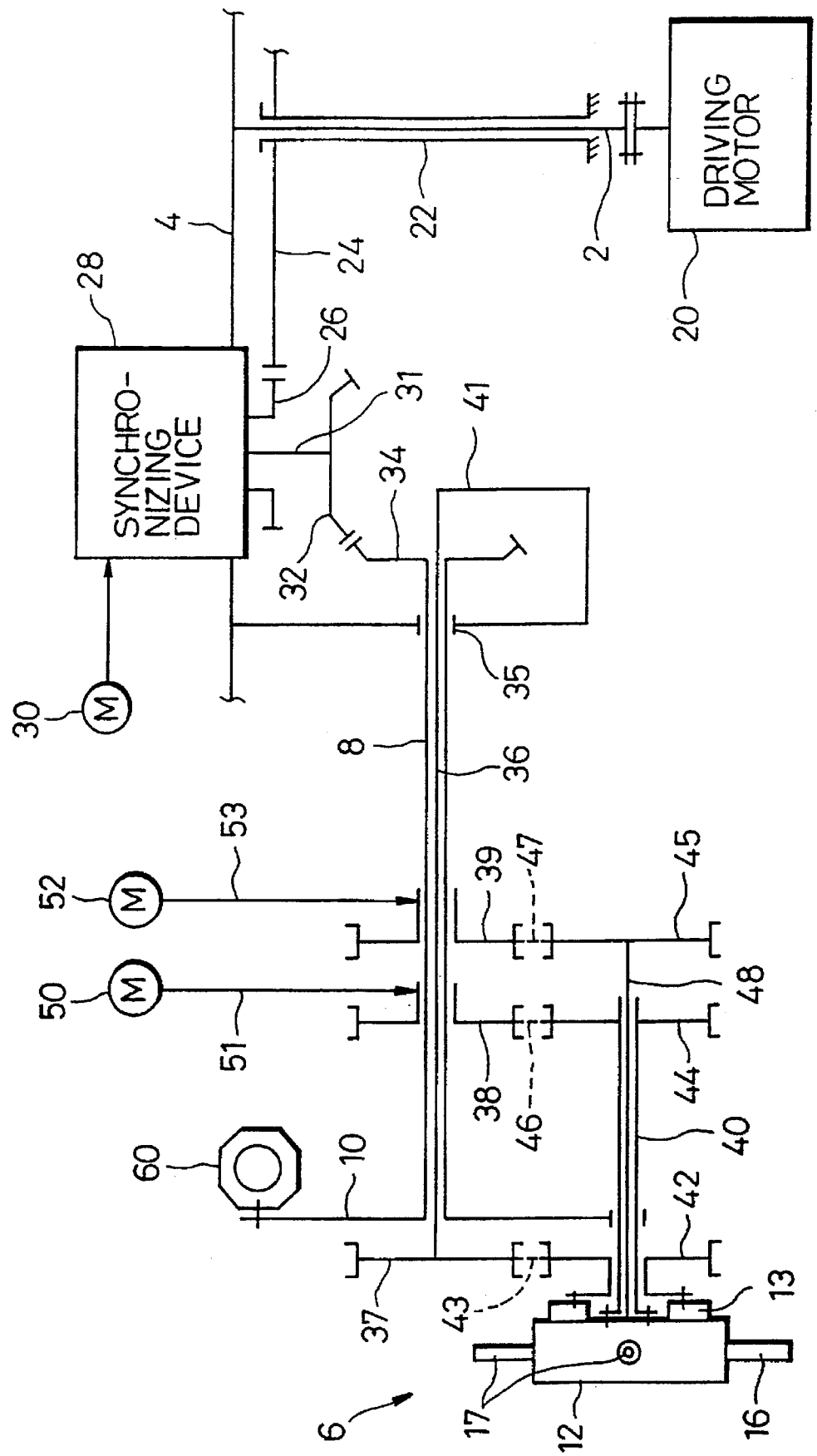
FIG. 3 is a diagram schematically showing the power transmission system in FIG. 2.

Referring to FIG. 2, there is illustrated in more detail a part of the drum 4, that is, the system for power transmission from the center shaft 2 to the nozzle head 12. FIG. 3 is a schematic illustration of the power transmission system.

The center shaft 2 is rotated in one direction by power from the drive motor 20 (FIG. 3), as mentioned above. The drum 4 is mounted to an upper portion of the center shaft 2. A fixed sleeve 22 is fitted around the center shaft 2 at a lower level than the drum 4 and rotatably supports the center shaft 2. A center gear 24 is fitted on an upper end portion of the fixed sleeve 22.

The center gear 24 is meshed with an input pinion 26 of a synchronizing device 28 which is fixed to the outer peripheral portion of the drum 4. When the drum 4 is rotated, the input pinion 26 of the synchronizing device 28 rotates because of the engagement with the center gear 24. In this case, since the center gear 24 is fixed, the input pinion 26 moves along the outer periphery of the center gear 24 while rotating. The input pinion 26 is rotated at a fixed rotational speed which is determined by the rotational speed of the drum 4. Accordingly, the input pinion 26 of the synchronizing device 28 is given a constant input with stability.

The synchronizing device 28 is equipped with a first control motor 30, an output shaft 31 and a differential mechanism (not shown), and the differential mechanism includes a ring gear, a planet gear and a sun gear. The ring gear and the sun gear are attached to the input pinion 26 and the output shaft 31, respectively. The planet gear can be rotated by power from the first control motor 30. When the first control motor 30 is driven, the differential mechanism increases or decreases the rotational input from the center gear 24 to the input pinion 26, in accordance with the direction and speed of rotation of the first control motor 30, and transmits the increased or decreased rotation to the output shaft 31.

The output shaft 31 of the synchronizing device 28 is connected to the turning shaft 8 via a pair of bevel gears 32 and 34. As is clear from FIG. 2, the turning shaft 8 has a base rotatably supported by the drum 4 and has a distal end fitted with the link arm 10.

When the drum 4 is rotated with the first control motor 30 stopped, the rotational input to the input pinion 26 of the synchronizing device 28 is directly transmitted to the output shaft 31 of the device 28, and the output shaft 31 is rotated at a fixed speed corresponding to the rotational speed of the drum 4. Thus, the output shaft 31 rotates the turning shaft 8 in one direction through the pair of bevel gears 32 and 34. In this case, the rotational speed of the turning shaft 8 is set relative to the aforementioned cycloid motion of the nozzle head 12 so that the ground speed of the suction nozzle 16 may become zero when the distal end of the nozzle 16 reaches the bottom dead center.

The turning shaft 8 is provided with a braking device 55, which includes a disk mounted on the turning shaft 8 and a brake band passed round the disk. The braking device 55 has the function of applying a predetermined frictional force to the turning shaft 8 during rotation of the shaft 8, to thereby stabilize the rotation of the turning shaft 8. More specifically, by applying a braking force to the turning shaft 8, the backlash of the meshed gears in the synchronizing device 28 and of the bevel gears 32 and 34 can be absorbed even if it is large, thereby ensuring stable rotation of the turning shaft 8.

The work mounting apparatus is further provided with rotary encoders for detecting the rotational speeds and rotational angles of the drum 4 and the turning shaft 8, and these rotary encoders are indicated by reference numeral 57 in FIG. 2.

The turning shaft 8 is hollow, and a fixed shaft 36 is inserted through the hollow space of the shaft 8. One end 41 of the fixed shaft 36 projects from the base of the turning shaft 8 and is rigidly supported by the drum 4. The other end of the fixed shaft 36 also projects from the distal end of the turning shaft 8 and is fitted with a toothed center pulley 37.

As clearly shown in FIG. 3, a hollow head shaft 40 rotatably penetrates one end of the link arm 10 and has one end connected to the nozzle head 12. A toothed planet pulley 42 is rotatably mounted on the head shaft 40 at a location between the link arm 10 and the nozzle head 12, and a toothed belt 43 is passed round the planet pulley 42 and the center pulley 37. The center pulley 37, the planet pulley 42 and the belt 43 constitute the aforementioned belt-type planetary mechanism.

A control ring 13 is attached integrally to the planet pulley 42 and surrounds the head shaft 40 coaxially therewith. The control ring 13 is pressed against the back surface of the nozzle head 12 in an airtight manner. Normally, therefore, the control ring 13 and the nozzle head 12 are connected together like a one-piece body. To press the control ring 13 against the nozzle head 12, a compression coil spring (not shown) is interposed between the planet pulley 42 and the one end of the link arm 10 so as to surround the head shaft 40.

Since the center pulley 37 is attached to the fixed shaft 36 as mentioned above, the center pulley 37 itself cannot rotate. As the planet pulley 42 revolves once around the turning shaft 8 together with the link arm 10, the planet pulley 42 itself makes one rotation. Accordingly, the planet pulley 42, that is, the nozzle head 12, revolves around the center pulley 37 while keeping the orientation thereof.

A toothed drive pulley 44 is mounted on the other end of the head shaft 40. The drive pulley 44 is connected to a toothed output pulley 38 by means of a toothed belt 46, and the output pulley 38 is rotatably supported on the turning shaft 8. The output pulley 38 can be rotated by power from a second control motor 50 which is fixed to the drum 4. To connect the output pulley 38 and the second control motor 50 to each other, a toothed pulley is mounted to each of the output pulley 38 and the output shaft of the second control motor 50 and a toothed belt 51 is passed round these toothed pulleys.

As the second control motor 50 is driven, the nozzle head 12 is rotated about the axis thereof, along with the head shaft 40, through the output pulley 38, the belt 46 and the drive pulley 44. Rotation of the nozzle head 12 can make one of the suction nozzles 17 directed downward. Namely, a suction nozzle to be used can be switched to by rotating the nozzle head 12. In the case where the suction nozzle 16 is not to receive or mount works during the cycloid motion of the nozzle head 12, the nozzle head 12 is rotated by 45 degrees, for example, whereby the nozzle head 12 makes cycloid motion above the aforementioned imaginary circle.

When the second control motor 50 is stopped, the output pulley 38 is held in a fixed state. In this case, the output pulley 38, the drive pulley 44 and the belt 46 constitute a planetary mechanism similar to the aforementioned mechanism including the center pulley 37, the planet pulley 42 and the belt 43. Accordingly, when the second control motor 50 is stopped, the drive pulley 44, that is, the nozzle head 12, revolves around the output pulley 38 with the orientation thereof kept fixed. As a result, when the output pulley 38 is held in a fixed state, the nozzle head 12 and the control ring 13 revolve around the turning shaft 8 as a unit without causing relative sliding motion therebetween.

A compensating shaft 48 is arranged within the head shaft 40. One end of the compensating shaft 48 projects into the nozzle head 12 and is connected to the suction nozzles 16 and 17 of the head 12 via a rotational angle transmission mechanism (not shown). The other end of the compensating shaft 48 projects from the head shaft 40 and is fitted with a toothed drive pulley 45. The drive pulley 45 is connected to a toothed output pulley 39 by means of a toothed belt 47, and the output pulley 39 is rotatably supported on the turning shaft 8. The output pulley 39 can be rotated by power from a third control motor 52. Like the second control motor 50, the third control motor 52 is fixed to the drum 4. The third control motor 52 and the output pulley 39 are connected to each other by a connecting mechanism similar to that provided between the second control motor 50 and the output pulley 38. Namely, a toothed pulley is mounted on each of the output shaft of the third control motor 52 and the output pulley 39 and a toothed belt 53 is passed round these pulleys. When the third control motor 52 is rotated, this rotation is transmitted to the compensating shaft 48 through the belt 53, the output pulley 39, the belt 47, and the drive pulley 45. Rotation of the compensating shaft 48 is then transmitted to the suction nozzles 16 and 17 via the aforementioned transmission mechanism within the nozzle head 12, whereby the suction nozzles 16 and 17 are rotated by a desired angle about their axis. Accordingly, in cases where the angular orientation of a work attracted to the distal end of the suction nozzle 16 is improper, the suction nozzle 16 is rotated about the axis thereof so as to correct the orientation of the work.

When the third control motor 52 is stopped, the output pulley 39 is held in a fixed state. In this case, the output pulley 39, the belt 47 and the drive pulley 45 constitute a planetary mechanism, and no relative rotation occurs between the nozzle head 12 and the compensating shaft 48.

The work mounting apparatus also includes rotary encoders for detecting the rotational angles of the nozzle head 12 and the compensating shaft 48, and these rotary encoders are indicated by reference numeral 57 in FIG. 2.

The balancer 60, which is attached to the other end of the link arm 10, has a mass substantially equal to that of the one-end side of the link arm 10 including the nozzle head 12. FIGS. 4 and 5 show details of the balancer 60. The balancer 60 has a casing 61 which is secured to the other end of the link arm 10 by a plurality of bolts 11.

The casing 61 extends in a direction perpendicular to the axis of the link arm 10. As clearly shown in FIG. 5, the casing 61 has an octagonal inner peripheral surface. The casing 61 is open at one end, and a cap 62 is screwed into the open end. Thus, the cap 62 and the casing 61 define a liquid chamber 66 inside the casing 61, and low-viscosity liquid is filled in the chamber 66. An oil seal 96 is interposed between the cap 62 and the casing 61 so as to keep the liquid chamber 66 fluid-tight. The oil seal 96 is fitted on the cap 62.

A spherical movable weight 63, which is made of steel, is contained in the liquid chamber 66. The movable weight 63 divides the liquid chamber 66 into left and right chambers $66_L$ and $66_R$, and is smoothly movable in the axial direction Y (FIG. 4) of the casing 61 while being guided by the inner surfaces of the liquid chamber 66. Further, a pair of centering springs 64 and 65 are arranged in the liquid chamber 66. The centering spring 64, which is a compression coil spring, is interposed between the inner end face of the liquid chamber 66 and the movable weight 63, and the other centering spring 65, which also is a compression coil spring, is interposed between the movable weight 63 and the cap 62.

The pair of centering springs 64 and 65 always push the weight 63 in opposite directions against each other, whereby the center of the movable weight 63 is situated at a neutral position NP within a plane X (FIG. 4) which contains both the axis of the nozzle head 12 and the axis of the link arm 10.

The centering springs 64 and 65 have predetermined spring constants and form a vibration system in cooperation with the movable weight 63. The spring constants and the weight of the movable weight 63 are selected so that the resonance frequency of the vibration system is substantially equal to the natural frequency of the head unit 6 and also that the weight of the movable weight 63 is substantially equal to that of the nozzle head 12 which is arranged substantially opposite to the movable weight 63. In the embodiment, the resonance frequency of the vibration system, that is, the natural frequency of the head unit 6, was about 30 to 40 hertz.

While the drum 4 is continuously rotated at a fixed speed, the head unit 6 undergoes constant-speed rotation and thus the distal end of the suction nozzle 16 traces an exact cycloid curve. However, when the rotational phase of the head unit 6 is changed to attract a work placed at a different work supply position, the head unit 6 must be accelerated or decelerated. In this case, since the head unit 6 vibrates at the resonance frequency thereof, the distal end of the suction nozzle 16 fails to trace the exact cycloid curve.

In such case, the vibration of the head unit 6 must be attenuated as soon as possible. With the arrangement of the present invention, in the case where the head unit 6 is accelerated, for example, the movable weight 63 exerts a force in a direction to push back the head unit 6, that is, to decelerate the unit 6, because the movable weight tends to remain at the same position due to inertia. When the movement of the head unit 6 is thereafter changed from acceleration to deceleration, the movable weight 63 exerts a force in a direction to accelerate the head unit 6, because the resonance frequency of the vibration system is substantially equal to the natural frequency of the head unit 6. Thus, in the arrangement of the present invention, the movable weight 63 exerts a force in such a direction as to resist the motion of the head unit 6. The above also applies to the case where the head unit 6 is decelerated.

In order to rapidly attenuate the vibration of the head unit 6, the inner diameter of the casing 61 is determined so that suitable restricted passages 68 are defined between the casing 61 and the movable weight 63. Specifically, the movable weight 63 is disposed in slide contact with four inner surfaces 69, out of the octagonal inner surfaces of the casing 61, at contact points CP as shown in FIG. 5, and a restricted passage 68 is defined between each of the remaining inner surfaces 71 and the movable weight 63. The restricted passages 68 are located at regular intervals in the circumferential direction of the movable weight 63 and always permit the communication between the left side $66_L$ and the right side $66_R$ of the liquid chamber 66. Accordingly, when the movable weight 63 moves to the left in FIG. 4, for example, the liquid filled in the casing 61 flows from the left chamber $66_L$ to the right chamber $66_R$, whereby the kinetic energy of the movable weight 63 is dissipated and thus the motion of the same is damped, making it possible to attenuate the vibration of the head unit in even shorter time. The flow areas of the passages 68 must be determined taking account of the viscosity of the liquid to be used. If the viscosity of the liquid is too high, the vibration system constituted by the movable weight 63 and the springs 64 and 65 does not function properly, and if the viscosity of the liquid is too low, the damping effect lessens and the vibration continues for a long time.

In the embodiment, machine oil was used as the liquid to be filled in the casing 61, and desirable results could be achieved when the dimensions of the passages 68 were selected so that the movable weight 63 vibrated several times before it came to a substantial stop.

Referring again to FIG. 2, there is also shown a system for supplying suction pressure and blow pressure to the control ring 13 of the nozzle head 12. The supply system includes an input port 14 formed in the control ring 13 and connected to a control valve 70 through a flexible tube 79. To the control valve 70 are connected a suction pressure supply line 76 and a blow pressure supply line 78. The control valve 70 is a normally-closed solenoid valve, and switching operation thereof causes the flexible tube 79 to be connected to one of the supply lines.

A switching valve 72 is inserted in the supply line 76 and divides the supply line 76 into upstream and downstream portions. A branch line 75 extends from the switching valve 72 and is connected to the upstream portion of the supply line 76. A pressure regulating valve 74 is inserted in the branch line 75. The switching valve 72 is a normally-closed solenoid valve, and when operated, connects the downstream portion of the supply line 76 to one of the upstream portion of the line 76 and the branch line 75. The pressure regulating valve 74 adjusts the blow pressure to be supplied to the switching valve 72 from the branch line 75. The aforementioned valves 70, 72 and 74 are arranged in the drum 4.

The supply lines 76 and 78 are connected, respectively, to connectors 80 and 81 arranged at an upper end portion of the center shaft 2. The connectors 80 and 81 are connected to passages 82 and 83 in the center shaft 2, respectively, and these passages 82 and 83 extend through the center shaft 2 in the axial direction thereof and are connected to annular grooves 84 and 85, respectively, via radial holes. The annular grooves 84 and 85 are formed in the outer peripheral surface of the center shaft 2.

Two radial holes are formed in the fixed sleeve 22 of the center shaft 2. The radial holes are connected at one end to the annular grooves 84 and 85, respectively, and the other ends of the radial holes are connected to connectors 86 and 87, respectively. The connector 86 is connected to an air compressor 88 serving as a blow pressure source, and the connector 87 is connected to a blower 89 serving as a negative pressure source.

Figure 6:
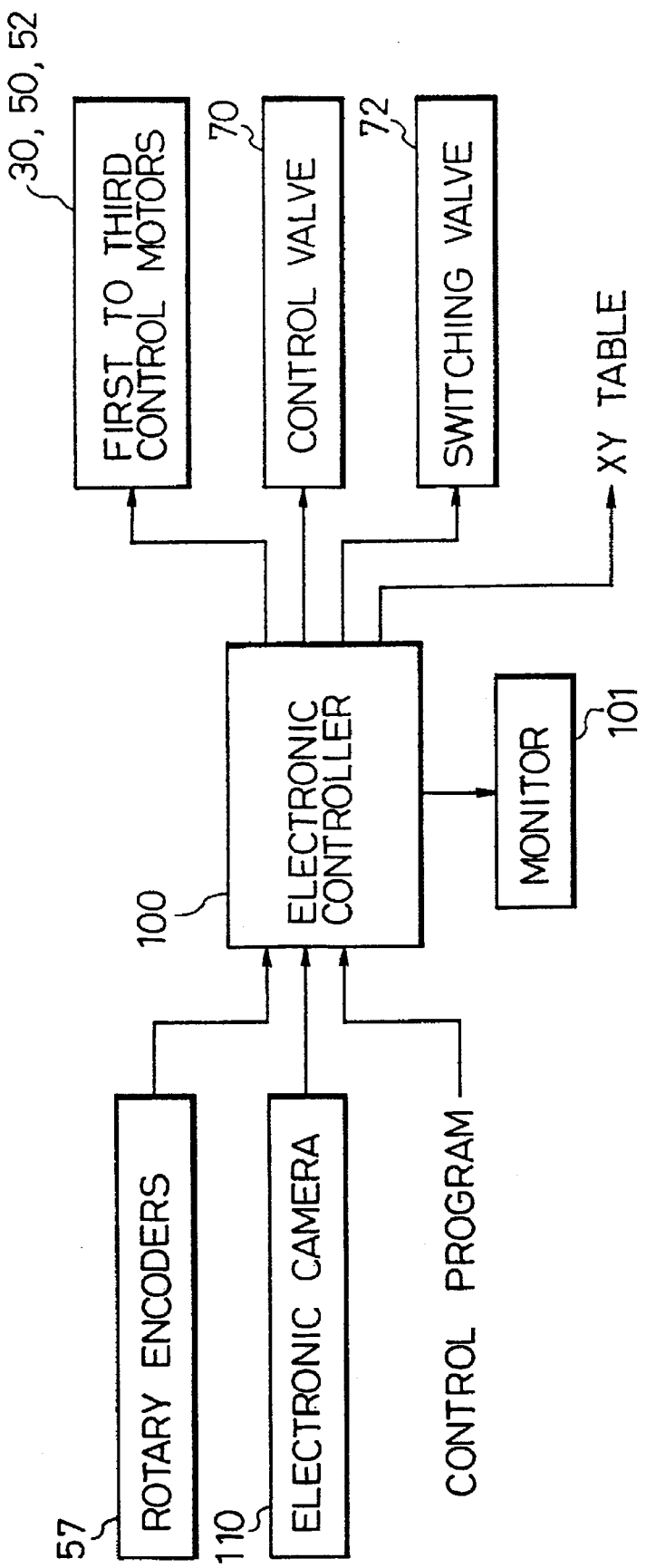
FIG. 6 is a schematic diagram of a control circuit for controlling the operation of the work mounting apparatus.

As shown in FIG. 6, the aforementioned valves 70 and 72 are electrically connected to an electronic controller 100. Also electrically connected to the electronic controller 100 are the aforementioned first to third control motors 30, 50 and 52, electronic camera 110, rotary encoders 57 and XY table, as well as a monitor 101. The monitor 101 displays the image from the electronic camera 110.

The electronic controller 100 controls the operations of the first to third control motors 30, 50, 52, control valve 70 and switching valve 72 in accordance with a control program for reception of works from the work feeders WF and mounting of works onto the printed board PB, and also based on the input signals from the electronic camera 110 and rotary encoders 57.

More specifically, in accordance with the control program, the electronic controller 100 selects a suction nozzle 16 to be used, from among the suction nozzles of one nozzle head 12, and causes the selected suction nozzle 16 to be directed downward. Namely, the electronic controller 100 drives the second control motor 50 associated with the nozzle head 12 concerned, and rotates the nozzle head 12 about the axis thereof to make the suction nozzle 16 directed downward.

As the drive motor 20 is driven, the drum 4 is rotated via the center shaft 2, and this rotation is transmitted to the turning shaft 8 through the aforementioned power transmission system. Thus, since the turning shaft 8 is rotated at a speed corresponding to the rotational speed of the drum 4, the nozzle head 12 repeatedly makes cycloid motion in the circumferential direction of the drum 4. In this case, the cycloid motion of the nozzle head 12 is set such that the ground speed of the suction nozzle 16 becomes zero when it reaches the bottom dead center.

While the nozzle head 12, that is, the suction nozzle 16, repeats the cycloid motion, the electronic controller 100 controls the cycle of the cycloid motion by means of the synchronizing device 28, in accordance with the control program. As a result, the suction nozzle 16 of the nozzle head 12 receives a work from a desired work feeder WF, then transports the received work to a position above the printed board PB, and mounts the work at a target position on the printed board PB in cooperation with the XY table, the operation of which is controlled by the electronic controller 100. When the reception and mounting of a work are performed by the suction nozzle 16, the cycle of the cycloid motion of the nozzle 16 is restored, whereby the ground speed of the distal end of the suction nozzle 16 becomes zero when the nozzle 16 reaches the bottom dead center.

In the process of transportation of the work toward the printed board PB together with the suction nozzle 16 of the nozzle head 12, the orientation of the work attracted to the suction nozzle 16 is photographed by the electronic camera 110. If it is judged based on the photograph data that the orientation of the work must be corrected, the electronic controller 110 drives the third control motor 52 to rotate the compensating shaft 48. Due to rotation of the compensating shaft 48, the suction nozzle 16 rotates about the axis thereof, and thus the orientation of the work is corrected. As a result, the accuracy in mounting the work onto the printed board PB is enhanced.

As will be clear from the above explanation, the cycle control of the cycloid motion is executed when the work feeder WF from which works have been supplied becomes empty and thus works are to be supplied from a standby work feeder WF, or when the received work is mounted at a target position on the printed board PB. The cycle control of the cycloid motion is achieved by varying the rotational speed of the turning shaft 8, that is, the revolving speed of the nozzle head 12 and balancer 60; therefore, the kinetic energy of the head unit 6 greatly varies, causing elastic, torsional deformation of the turning shaft 8 due to the variation. Although the torsional deformation of the turning shaft 8 tends to cause vibration of the head unit 6, that is, the nozzle head 12, such vibration is efficiently absorbed by the aforementioned balancer 60.

This will be explained in more detail. The weight of the movable weight 63 accounts for most of the weight of the balancer 60. Thus, when the revolving speed of the balancer 60 varies, the movable weight 63 tends to remain at the aforementioned neutral position NP due to its own inertia, against the urging force of the centering spring 64 or 65, and thereafter the vibration of the head unit 6 is absorbed and damped as mentioned above.

Since the balancer 60, or more specifically, the movable weight 63 thereof, and the nozzle head 12 are separated from each other in the diametrical direction of the head unit 6, the inertial force acting upon the movable weight 63 is opposite in direction to the acceleration or deceleration of the nozzle head 12, with respect to the circumferential direction of the head unit 6. Further, since the spring constants of the pair of centering springs 64 and 65 are set to values such that the natural frequency of the head unit 6 is substantially equal to the resonance frequency of the vibration system including the movable weight 63, as mentioned above, the inertia of the movable weight 63 serves to cancel out the vibration of the head unit 6 or the nozzle head 12. Consequently, even in the case where the operational speed of the work mounting apparatus is increased, the turning shaft 8 does not undergo large torsional deformation, and the vibration of the nozzle head 12 can be effectively absorbed.

Further, since the movable weight 63 relatively vibrates while allowing the liquid in the liquid chamber 66 to flow between the left and right chambers $66_L$ and $66_R$, the liquid in the chamber 66 serves as resistance to the displacement of the movable weight 63. Consequently, the relative vibration of the movable weight 63, that is, the vibration of the nozzle head 12, is damped in short time.

Thus, the vibration of the nozzle head 12 is effectively absorbed and promptly damped by the action of the balancer 60; therefore, the suction nozzle 16 of the nozzle head 12 can reliably receive a work from the work feeder WF and mount the received work at the target position on the printed board PB with high accuracy.

The balancer 60 can provide the above-described function not only when the cycle of the cycloid motion is controlled, but also when external force, for example, vibration of the work mounting apparatus itself, acts upon the head unit 6 and causes the same to vibrate in the revolving direction.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A work mounting apparatus comprising:
    a carrier movable along a predetermined transport path, said carrier movable along a predetermined transport path, said carrier including a shaft intersecting with the transport path and a receiving/mounting head spaced from the shaft, the receiving/mounting head having a rod-shaped attraction member projecting toward the transport path;
    turning means for causing the head to revolve around the shaft while maintaining orientation of the head with respect to the transport path during movement of said carrier, the attraction member of the head repeatedly making cycloid motion along the transport path;
    supply means for supplying the attraction member of the head with an attraction force;
    control means for controlling a cycle of the cycloid motion and the supply of the attraction force to the attraction member, the attraction member receiving a work from a work receiving position on the transport path and mounting the received work onto a mounting surface on the transport path while making the cycloid motion, the mounting surface being arranged at a distance from the work receiving position; and
    stabilizing means for stabilizing motion of the attraction member in the revolving direction of the head during revolution of the head, the stabilizing means includes a balancer arranged on said carrier so as to be symmetrical with respect to the head about the shaft, the balancer having a weight equal to that of the head side and having a damping function to absorb vibration of the head in the revolving direction thereof, the balancer includes a casing, a movable weight contained in the casing and capable of reciprocatory movement in the revolving direction of the head, and urging means for elastically urging the movable weight so as to hold the movable weight in a neutral position, the neutral position being situated in a plane containing the center of the head and the axis of the shaft.

2. The work mounting apparatus according to claim 1, wherein the casing has an interior thereof filled with a liquid, and the movable weight divides the interior of the casing into two chambers always communicating with each other.

3. The work mounting apparatus according to claim 2, wherein the casing extends in a direction tangent to the revolution of the head, and the urging means includes a pair of springs arranged in the respective chambers and pressing the movable weight from both sides thereof.

4. The work mounting apparatus according to claim 3, wherein the pair of springs each comprise a compression coil spring.

5. The work mounting apparatus according to claim 3, wherein the movable weight has a spherical shape, and the casing has a plurality of guide surfaces for guiding movement of the movable weight.

6. The work mounting apparatus according to claim 5, wherein the balancer further includes restricting means for restricting flow of the liquid between the two chambers.

7. The work mounting apparatus according to claim 6, wherein the restricting means includes a plurality of restricted passages formed between the inner peripheral surface of the casing and the movable weight.

8. The work mounting apparatus according to claim 7, wherein the casing has octagonal inner surfaces, alternate ones of the inner surfaces in the circumferential direction of the movable weight forming the guide surfaces for the movable weight, and the restricted passages being defined between the movable weight and the other inner surfaces.

* * * * *